(12) United States Patent  
Xu et al.

(10) Patent No.: US 7,420,247 B2
(45) Date of Patent: Sep. 2, 2008

(54) POWER LDMOS TRANSISTOR

(75) Inventors: Shuming Xu, Schnecksville, PA (US); Jacek Korec, Sunrise, FL (US)

(73) Assignee: Cicion Semiconductor Device Corp., Bethlehem, PA (US)

( * ) Notice: Subject to any disclaimer, the term of this patent is extended or adjusted under 35 U.S.C. 154(b) by 362 days.

(21) Appl. No.: 11/202,981

(22) Filed: Aug. 12, 2005

(65) Prior Publication Data

US 2007/0034942 A1    Feb. 15, 2007

(51) Int. Cl.
*H01L 29/72* (2006.01)

(52) U.S. Cl. .............. 257/343; 257/329; 257/336; 257/340; 257/341; 257/401

(58) Field of Classification Search ............ 257/329, 257/336, 340, 341, 343, 401
See application file for complete search history.

(56) References Cited

U.S. PATENT DOCUMENTS

| | | | |
|---|---|---|---|
| 4,455,565 A | 6/1984 | Goodman et al. | |
| 4,754,310 A | 6/1988 | Coe | |
| 5,155,563 A | 10/1992 | Davies et al. | |
| 5,216,275 A | 6/1993 | Chen | |
| 5,252,848 A | 10/1993 | Adler et al. | |
| 5,841,166 A | 11/1998 | D'Anna et al. | |
| 5,907,173 A | 5/1999 | Kwon et al. | |
| 5,912,490 A | 6/1999 | Hebert et al. | |
| 5,949,104 A | 9/1999 | D'Anna et al. | |
| 6,001,710 A | 12/1999 | Francois et al. | |
| 6,215,152 B1 | 4/2001 | Hebert | |
| 6,372,557 B1 | 4/2002 | Leong | |
| 6,521,923 B1 | 2/2003 | D'Anna et al. | |
| 6,600,182 B2 * | 7/2003 | Rumennik | 257/288 |
| 6,677,641 B2 | 1/2004 | Kocon | |
| 6,720,618 B2 | 4/2004 | Kawaguchi et al. | |
| 6,831,332 B2 * | 12/2004 | D'Anna et al. | 257/343 |
| 7,235,845 B2 * | 6/2007 | Xu et al. | 257/343 |
| 2005/0017298 A1 | 1/2005 | Xie et al. | |

OTHER PUBLICATIONS

Cheon Soo Kim et al., Trenched Sinker LDMOSFET (TS-LDMOS) Structure for High Power Amplifier Application above 2 GHz, IEEE No. 0-7803-7050-3/01, 2001, pp. IEDM 01-887—IEDM 01-890.

(Continued)

*Primary Examiner*—Edward Wojciechowicz
(74) *Attorney, Agent, or Firm*—Duane Morris LLP (57) ABSTRACT

A LDMOS transistor comprises a trench formed through the epitaxial layer at least to the top surface of the substrate, the trench having a bottom surface and a sidewall contacting the source region and the portion of the channel region extending under the source region. A first insulating layer is formed over the upper surface and sidewall surfaces of the conductive gate. A continuous layer of conductive material forming a source contact and a gate shield electrode is formed along the bottom surface and the sidewall of the trench and over the first insulating layer to cover the top and sidewall surfaces of the conductive gate. A second insulating layer is formed over an active area of the transistor, including over the continuous layer of conductive material and filling the trench. A drain electrode can extend over the second insulating layer to substantially cover the active area.

10 Claims, 5 Drawing Sheets

OTHER PUBLICATIONS

Yasuhova, Matsushita et al., "Low Gate Charge 30 V N-channel LDMOS for DC-DC converters," International Symposium On Power Semiconductor Devices & ICS (15TH: 2003: Cambridge, England) (4 pages).

Xu, Baiocchi et al., "High Power Silicon RF LDMOSFET Technology for 2.1 GHZ Power Amplifier Applications," IEE Proceedings—Circuits Devices Syst. vol. 151, No. 3, Jun. 2004 pp (4 pages).

Xu, Shibib et al., "High Performance RF Power LDMOSFET Technology for 2.1 GHZ Power Amplifier Applications" Microwave Symposium Digest, 2003 IEEE MTT-S International Publication Date: Jun. 8-13, 2003 vol. 1, pp. 217-220.

* cited by examiner

POWER LDMOS TRANSISTOR

CROSS-REFERENCE TO RELATED APPLICATION

This application is related to commonly assigned, U.S. Pat. application Ser. No. 11/202,968 of the same title, filed on the same date hereas, now U.S. Pat. No. 7,235,845, the entirety of which is hereby incorporated by reference herein.

FIELD OF THE INVENTION

The present invention relates to semiconductor structures and more particularly to laterally diffused MOS transistors (LDMOS), and still more particularly to LDMOS transistors designed for low voltage power management applications.

BACKGROUND OF THE INVENTION

Power MOSFETs (metal oxide semiconductor (MOS) field effect transistors (FET)) are used as electric switches for high frequency PWM (pulse width modulation) applications such as voltage regulators and/or as load switches in power applications. When used as load switches, where switching times are usually long, cost, size and on-resistance of the switches are the prevailing design considerations. When used in PWM applications, the transistors must exhibit small power loss during switching, which imposes an additional requirement—small internal capacitances—that make the MOSFET design challenging and often times more expensive. Special attention has been paid to the Gate-to-Drain (Cgd) capacitance, as this capacitance determines the voltage transient time during switching and is the most important parameter affecting the switching power loss.

Prior art laterally diffused MOSFET (LDMOS) devices use thick epitaxial layers to achieve high breakdown voltage (>60V) required for the target RF applications. To minimize the parasitic source inductance in the assembly, devices are designed on P+ substrates leading the source electrode to the back side of the die. The thick epitaxial layer and P+ substrate result in a high on resistance ($R_{ds,on}$) of the device, which is not acceptable for power management applications. Also, both device concepts lead to a stripe layout of the drain electrode. This in turn leads to a de-biasing effect known for lateral devices (voltage drop along a stripe electrode under high current conditions) and limits the current handling capability of the transistor. Further, the shield gate tends to be laterally constrained to the space between the gate and the drain electrodes and is applicable only to a stripe layout of the drain electrode.

There remains a need, therefore, for an LDMOS structure with improved device performance ($R_{ds,on}$ and Cgd) as well as improved manufacturability.

SUMMARY OF THE INVENTION

A laterally diffused metal-oxide-semiconductor transistor device is provided comprising a doped substrate having bottom and top surfaces and an epitaxial layer thereover having an upper surface. Source and drain regions of a first conductivity type are formed in the epitaxial layer proximate the upper surface of the epitaxial layer, the source and drain regions being spaced from one another and having a channel region of a second conductivity type formed therebetween in the epitaxial layer, the channel region having a portion extending under the source region, wherein the drain region comprises a lightly doped drain region formed adjacent to the channel region. A doped drain contact region is spaced from the channel region by the lightly doped drain region. A conductive gate is provided having an upper surface and sidewall surfaces, the conductive gate formed over a gate dielectric layer formed over the channel region, the conductive gate partially overlapping the source and drain regions. A trench is formed through the epitaxial layer at least to the top surface of the substrate, the trench having a bottom surface and a sidewall contacting the source region and the portion of the channel region extending under the source region. A first insulating layer is formed over the upper surface and sidewall surfaces of the conductive gate. A continuous layer of conductive material forming a source contact and a gate shield electrode is formed, the continuous layer of conductive material formed along the bottom surface and the sidewall of the trench and over the first insulating layer to cover the top and sidewall surfaces of the conductive gate. A second insulating layer is formed over an active area of the transistor, including over the continuous layer of conductive material, the second insulating layer filling the trench. A drain electrode is electrically coupled to the drain contact.

In embodiments of an LDMOS transistor, the drain electrode comprises a first portion extending through the second insulating layer to electrically couple to the drain contact and a second portion extending over the second insulating layer to substantially cover the active area.

The improved LDMOS transistor provides the advantageous switching performance of an LDMOS transistor while introducing a large current handling capability due to a large vertical current flow and large, continuous source and drain electrodes. At the same time, the pitch of the design of the device cell is minimized by the implementation of the continuous source contact structure which provides for a high channel density (i.e., specific Rds is Rds multiplied by the transistor area, so smaller pitch means smaller Rds*A) and resulting specific low on-resistance of the transistor. Further, the improved LDMOS device provides manufacturing advantages, as various elements can be formed from a single, continuous conductive layer. The contribution of the substrate to the overall resistance of the device is advantageously kept at a low level by using substrates having very low thicknesses.

The above and other features of the present invention will be better understood from the following detailed description of the preferred embodiments of the invention that is provided in connection with the accompanying drawings.

BRIEF DESCRIPTION OF THE DRAWINGS

The accompanying drawings, which are not drawn to scale unless otherwise stated, illustrate preferred embodiments of the invention, as well as other information pertinent to the disclosure, in which.

DETAILED DESCRIPTION

As used herein, the following dopant concentrations are distinguished using the following notations:

(a) N++ or P++: dopant concentration >$5\times10^{19}$ atoms/cm$^3$;

(b) N+ or P+: dopant concentration of $1\times10^{18}$ to $5\times10^{19}$ atoms/cm$^3$;

(c) N or P: dopant concentration of $5\times10^{16}$ to $1\times10^{18}$ atoms/cm$^3$;

(d) N− or P−: dopant concentration of $1\times10^{15}$ to $5\times10^{16}$ atoms/cm$^3$;

(e) N−− or P−−: dopant concentration <$1\times10^{15}$ atoms/cm$^3$.

Figure 1:
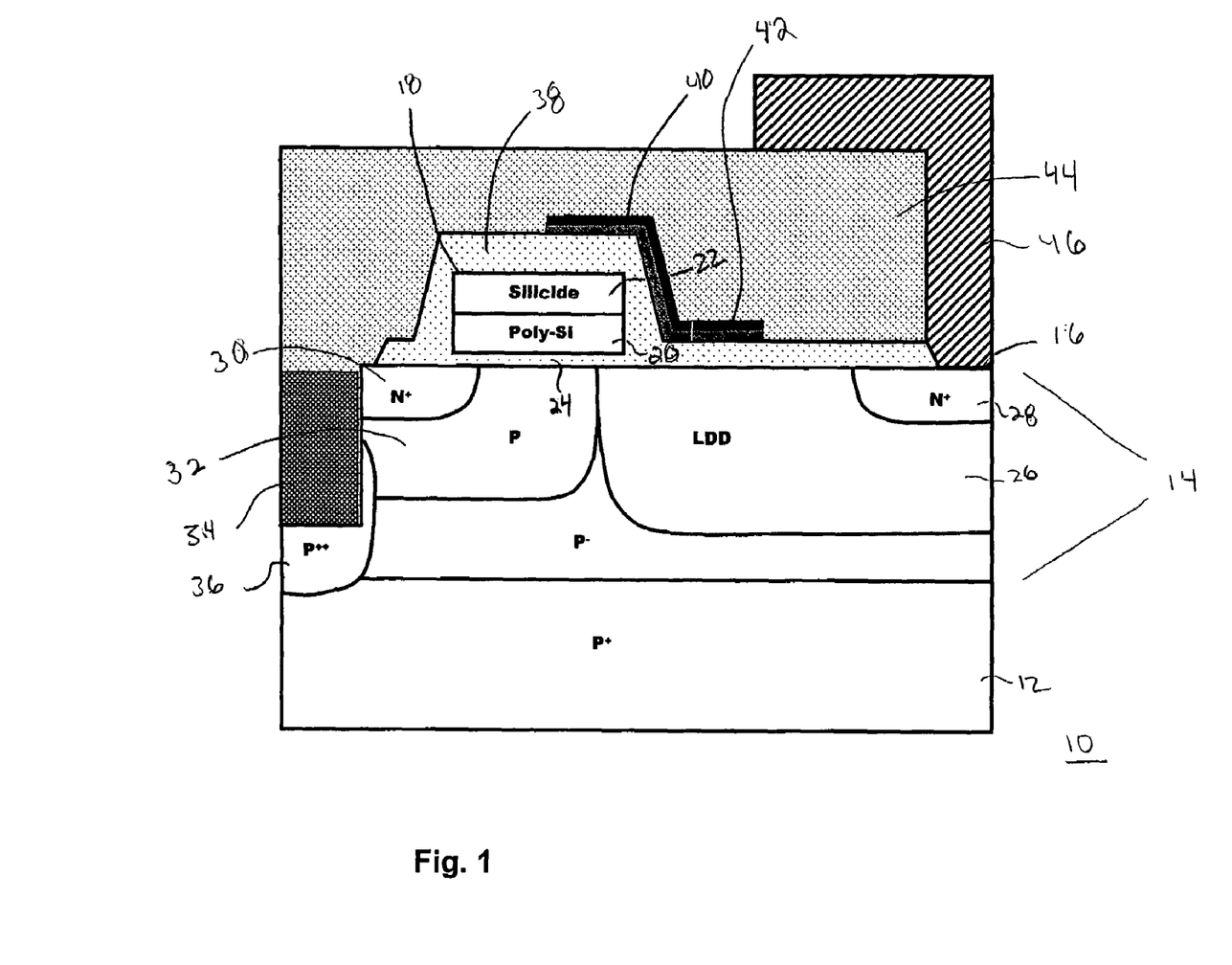
FIG. 1 is an illustration of a LDMOS transistor.

FIG. 1 is an illustration of a LDMOS transistor device 10, specifically an n-channel device. The transistor structure 10 illustrates different prior art transistor features, such as described in U.S. Pat. No. 6,831,332 to D'Anna et al., and in U.S. Pat. No. 5,252,848 to Adler et al., the entirety of which are hereby incorporated by reference herein and discussed later in more detail. The transistor structure 10 includes a semiconductor substrate 12, which, in the illustrated embodiment, is a highly doped (P+) silicon wafer doped with boron. A source electrode (not shown) is coupled to the bottom surface of substrate 12 when the transistor structure 10 is packaged.

A lightly doped silicon epitaxial layer 14 is formed over the substrate 12 and has an upper surface 16. In the illustrated transistor 10, the epitaxial layer 14 has a dopant concentration of P−. The epitaxial layer 14 is relatively thick, such as having a thickness between about 5 to 8 μm, to provide a high breakdown voltage.

A conductive gate 18 overlies the upper surface 16 of the epitaxial layer 14. The conductive gate 18 comprises a lower doped polysilicon layer 20 with an upper silicide layer 22 formed therein or thereover. The conductive gate 18 is formed over a gate dielectric layer 24, such as comprising SiO$_2$, formed to a thickness between about 150 to 500 Å.

Lightly doped drain (LDD) region 26 is formed completely within epitaxial layer 14 and forms an enhanced drift region adjacent to more heavily doped drain implant region 28 and spaced from more heavily doped source implant region 30. The enhance drain drift region 26 increases the drain-to-source breakdown voltage of the LDMOS structure 10.

A body region 32 having P-type dopants and having a dopant concentration of P is formed in epitaxial layer 14 and has a subregion between the source 30 and enhanced drain region 26, forming a channel region therebetween. A conductive source contact plug 34, also known as a sinker, is deposited in a shallow trench region formed only partially through the epitaxial layer 14 and the adjacent to the sidewalls of the source implant region 30 and body region 32. A highly doped body contact region 36 is formed in the epitaxial layer 14 and shorts the body region 32 to the contact plug 34 and the contact plug 34 to the substrate 12, and thus to the source electrode coupled thereto (not shown).

The short between the body region 32 and the source contact 30 defines the path for the current generated during the avalanche condition, i.e., when the electric field at the body-to-drain PN-junction is so high that it leads to a generation of minority carriers by impact ionization.

An insulation layer 38 is formed over the source and drain implant regions 28, 30, over the conductive gate sidewalls (forming sidewall spacers) and upper surface of the gate 18, as well as over the enhanced drain drift region 26. A layer or layers of conductive material is formed over the gate 18, a gate sidewall proximate to the drain implant region 28, and a portion of insulation layer 38 overlying the enhanced drift region 26, such as described in U.S. Pat. No. 5,252,848 to Adler et al. The conductive layer or layers comprise a region forming a shield electrode 40 and a region forming a field plate 42.

A second insulation layer 44 overlies the active region, with a contact opening formed therein in which a metal drain electrode 46 is partially formed. Drain electrode 46 has a finger-shape, such as shown in U.S. Pat. No. 6,831,332 to D'Anna et al.

The problems with this structure relate to the resistive contribution of the P+ substrate, and the de-biasing effect resulting from the finger type of layout of the drain electrode. Also, as the sinker has to reach the substrate through a thick epitaxial layer, usually its width contributes significantly to the pitch of the transistor cell and it requires a complex manufacturing process.

Figure 2:
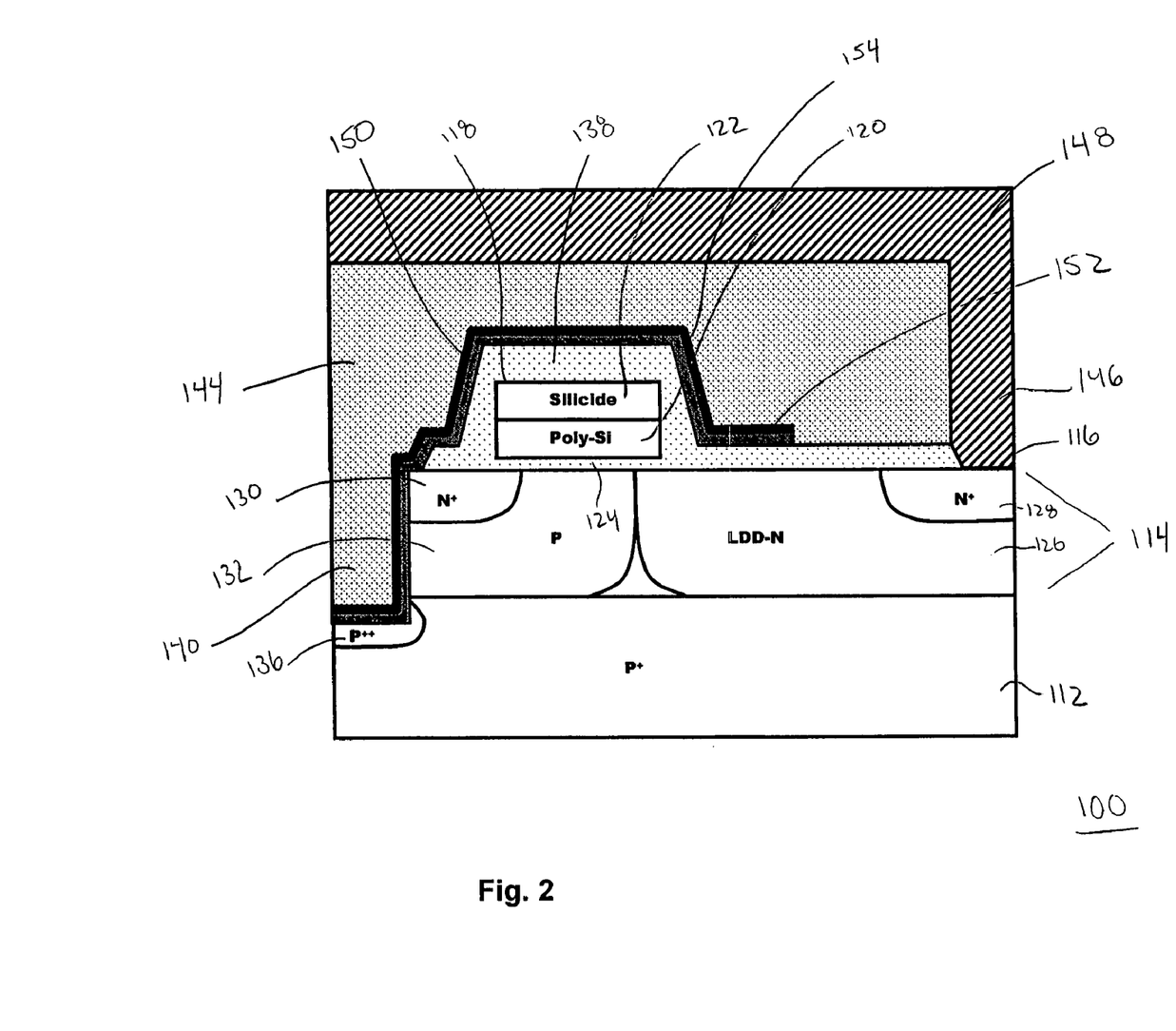
FIG. 2 is an illustration of an improved LDMOS transistor according to the present invention.

Turning now to FIG. 2, an improved power transistor, more specifically an improved LDMOS transistor 100, is provided. In exemplary applications, the transistor 100 is used as a switch in a voltage regulator of a power supply for, for example, a server or desktop computer or in a DC/DC converter for general use.

The transistor 100 structure includes a substrate 112, which is preferably a silicon wafer substrate highly doped with P-type dopants, such as boron, and having P+ dopant concentration. A source electrode (not shown) comprising a conductive material such as Ti/Ni/Ag is coupled to the bottom surface of the substrate 112 during packaging of the device. The source electrode preferably comprises a planar electrode extending over the entire bottom surface of the substrate 110. In an exemplary embodiment, substrate 112 has a thickness of less than 100 μm, and preferably less than about 75 μm (about 3 mils), and most preferably has a thickness equal to about 50 μm (2 mils), thereby minimizing the contribution of the substrate to the on-resistance of the transistor. The substrate can be grinded and etched, or otherwise formed, to this desired thickness. Such processes, if undertaken, would typically be done toward the end of the processing of the substrate wafer.

An epitaxial layer 114 is formed over the substrate 112 and has an upper surface 116. In certain embodiments, the epitaxial layer 114 can have dopants of N (arsenic or phosphorous) or P (boron) dopant type and a dopant concentration of N− or P−. The epitaxial layer 114 preferably has a thickness that is less than the thickness of epitaxial layer 14. In one embodiment, the epitaxial layer 114 has a thickness between about 2 to 3 μm including the transition region of the dopant concentration gradient.

The doping of the epitaxial layer 114 is usually much lower than the doping concentration of the implanted source/drain regions. On the other hand, in case of devices with vertical current flow, the background doping of the epitaxial layer is preferably as high as possible in order to reduce the on resistance between the drain and source (Rds,on) while being just low enough to meet the targeted breakdown voltage of the transistor. With the present device, the original doping of the epitaxial layer 114 has no effect on the resistance of the device because current flows through the vertical source contact region (discussed below). Thus, the doping concentration of the epitaxial layer can be kept very low, preferably at or below $2\times10^{16}$ atoms/cm$^3$, for example.

A conductive gate 118 overlies the upper surface 116 of the epitaxial layer 114. In the embodiment illustrated in FIG. 2, the conductive gate 118 comprises a lower doped polysilicon layer 120 with an upper silicide layer 122 formed therein or thereover by processes familiar to those in the art. Silicide layer 122 can comprise any transition metal silicide, and in exemplary embodiments is selected from the group consisting of Ti, W and Co. The conductive gate 118 preferably has a thickness between about 0.3 to 0.6 μm and a length defined by the technology generation utilized in its fabrication, e.g., 0.8 μm, 0.5 μm, 0.35 μm. or 0.25, etc. The conductive gate 118 is formed over a gate dielectric 124, which preferably comprises $SiO_2$ formed to a thickness between about 150 to 500 Å.

Drain implant region 128, having dopant concentration N+, is formed in epitaxial layer 114. Lightly doped drain region 126 is formed completely within epitaxial layer 114 and forms an enhanced drift region. The enhanced drift region is formed abutting or at least proximate to the upper surface 116 of layer 114 and, in an exemplary embodiment, extends for the thickness of epitaxial layer 114 down to the upper surface of substrate 112. The lightly doped drain region 126 forms a PN junction with the substrate 112 and provides a pre-defined space between the substrate 112 and the drain contact region 128 to pin the location of the electric breakdown of the field transistor. By doing so it is secured that no hot carriers associated with convention LDMOS transistors are generated in the vicinity of the gate oxide, which can limit the long term reliability of these devices. In other words, the location of the electric breakdown beneath the drain contact region 128 substantially improves the reliability of the product. It allows even to operate the transistor under avalanche breakdown conditions, which is an important feature for many power applications. The region 126 has a dopant concentration N in the illustrated embodiment. In certain embodiments, lightly doped drain region 126 has a lateral dimension between about 0.5 and 0.8 μm. The region 126 preferably extends below (i.e., is overlapped by) the conductive gate 118 between about 0.05 to 0.15 μm.

The LDMOS structure 100 also includes a source implant region 130 having a conductivity N+ spaced from the enhanced drift region 126. Source implant region 130 extends laterally between about 0.5 to 0.8 μm, has a depth between about 0.15 to 0.3 μm and also partially underlies the conductive gate between about 0.05 to 0.15 μm. A body region 132 having P-type dopants and having a conductivity of P concentration is formed in epitaxial layer 114 and has a subregion between the source 130 and enhanced drain region 126, forming a channel region therebetween. In an exemplary embodiment, the body region 132 is formed to a depth preferably equal to about the thickness of the epitaxial layer 114, i.e., it abuts (i.e., lies adjacent to or touches) the heavily doped substrate 112. This feature helps avoid the turn-on of the parasitic bipolar transistor. This event can occur when stored or generated minority carriers have to flow through the body region 132 to the source contact 150. If the flow of the minority carriers results in a lateral voltage drop larger than 0.7V underneath of the source region 130, this voltage bias the end of the PN junction between the source region 130 and the body region 132 in the forward direction and the NPN bipolar transistor turns on. Such event results in an exaggerated heat dissipation and leads to a destruction of the device. The usual way to protect the transistor against the bipolar effect is to insure a low resistance of the body region underneath the source implant 130 and to make the lateral extension of the body region 132 as short as possible. In the case of the device 100, the minority carriers flowing into the body region 132 will flow the shortest path to the substrate 112 (i.e., through region 132 and not contact 150), which is at ground potential and will not cause any significant voltage drop.

Like device 10, the transistor device 100 also includes an insulating layer 138 formed over the source implant region 130, over the sidewalls of the conductive gate 118 (forming side spacers) and its upper surface, as well as over the enhanced drain drift region 126 and drain implant region 128. The insulating layer 138 preferably comprises $SiO_2$ or $SiO_xN_y$. It should be understood, however, that insulating layer 138 can comprise several layers of insulating materials collectively forming insulating layer 138. Insulating layer 138 is preferably formed to a thickness of at least 0.03 μm on the sidewalls of the conductive gate 118 and at least 0.05 μm on the top surface of the conductive gate 118. In an exemplary embodiment, insulating layer 138 is formed to a thickness between about 0.05-0.15 μm over the drain drift region 126 and drain implant region 128. The insulating layer 138 insulates the drain and gate regions from the source contact layer described below.

The ratio of the gate-to-drain capacitance (Cgd) to the gate-to-source capacitance (Cgs) can be adjusted simply by the choice of the thickness of the insulating layer 138 spacing the gate shield from the gate electrode. In the conventional approach there is a problem of how to minimize the Cgd capacitance. Because of the Cgd coupling, any change of the drain voltage will result in a displacement current injected into the gate. This charge can be accommodated in the Cgs capacitor or has to flow to ground through the gate resistance and the gate driver. If the Cgd/Cgs ratio is too large (e.g. larger than 0.1) the drain voltage transients lead to a bounce of the gate voltage, which in turn can turn-on the MOSFET. This effect is called a shoot-through condition and presents a problem in many power electronics applications. With the present device 100, the overlap region between gate 118 and drain 126 is minimal, and the coupling between the gate electrode 118 and the drain electrode 148 is cut out by the shield electrode 154. Thus, the ratio of Cgd/Cgs capacitances is inherently small and can be further adjusted by a reduction of the thickness of the insulating layer 138 which increases the capacitance Cgs.

Further, the value of the Coss (i.e., (Cds+Cdg)) can be adjusted by the choice of the thickness of the insulating layer 144 between the shield electrode 154 and the drain electrode 148. Some applications demand a large output capacitance to minimize the ringing of the drain voltage during switching. Actually a more efficient way to damp the ringing is to attach a snubber between the drain and source terminals. A snubber can be created by a capacitor and a resistor put in series. Such a snubber circuit can be integrated within the transistor by using the increased Coss capacitance and adding a pre-defined resistor between the shield and the source electrodes. This resistor can be incorporated into the shield electrode by etching some opening(s) through the layer 150.

A deep trench 140 is etched adjacent to and contacting the source implant region 130 and body region 132. The trench 140 is preferably formed entirely through the epitaxial layer 114 and, optionally, partially into the substrate 112, such as to a depth of 0.5 to 1.0 μm into substrate layer 112 to reach through the transition region of the dopant gradient. A highly doped contact implant region 136 is then formed in the substrate 112 having a concentration P++. The implant region 136 preferably has a depth between about 0.2 to 0.5 μm and ensures good contact between the substrate 112 and the subsequently formed source contact.

After etching trench 140 through epitaxial layer 114 and forming highly doped contact region 136, a conductive layer 150 is formed as shown in FIG. 2. In an exemplary method, the layer 150 is preferably formed by a CVD deposition of a silicide layer 150 which is subsequently patterned to form the shield electrode 154. As explained in more detail below, the continuous layer 150 forms a source contact, a gate shield and a field plate for the LDMOS transistor 100. The layer 150 can comprise one or more stacked conductive layers or materials. In exemplary embodiments, the layer 150 comprises a conductive material selected from the group consisting of Polysilicon/W, $WSi_2$, $TiSi_2$ or $CoSi_2$, formed to a substantially uniform thickness between about 0.2 to 0.3 μm. In alternative embodiments, the conductive layer 150 could comprise a silicide (one of above) and a barrier layer (e.g., Ti, TiN or Ti/TiN). The continuous layer 150 forms a source contact that shorts the source implant region 130, body region 132 and highly doped contact region 136. Further, the continuous layer 150 extends over insulation layer 138, over gate 118 and the sidewall spacers of the gate 118 to form a gate shield 154, which shields the gate 118 and source 130 from the drain electrode. Still further, the continuous layer 150 extends over a portion of the insulation layer 138 that is formed over lightly doped region 126 to form a field plate portion 152. As those in the art will understand, the field plate 152 functions to spread the otherwise high localized electric field from near the gate 118 toward the drain implant region 128.

The formation of a single, continuous conductive layer 150 greatly simplifies the fabrication of a LDMOS structure, as the source contact, gate shield and field plate can be formed using the same fabrication step. A single, continuous conductive layer serves as a source contact and a shield electrode, which shields the conductive gate from the drain electrode and reduces the capacitance between the gate and drain (Cgd). There is no need to form a separate gate shield or field plate nor is there a need to separately connect the gate shield to the source. Further, there is no need to form a conductive sinker in the trench 140. After the deposition and patterning of the layer 150, the trench 140 is filled with an isolator during the deposition of the insulating layer 144. The manufacturability of the device is thereby greatly improved.

Further, direct contact between the source contact and the substrate 112 is made, as the highly doped implant region 136 is formed entirely in the substrate 112 and directly contacts the source contact layer 150. This provides for a low resistance contact, improving Rds-on.

After formation of the conductive layer 150, a second insulation layer 144 is deposited to fill trench 140 and cover the active region of the transistor 100. This insulation layer may comprise one or more dielectric layers, and preferably comprises a $SiO_2$ or $SiO_xN_y$ deposited at low temperature and optionally followed by a deposition of BPSG (Boron Doped Phosphosilicate Glass). In exemplary embodiments, the dielectric layer 144 has a thickness defined from the top surface 16 of the epitaxial layer 114 to its upper surface between about 1.0-1.5 μm.

After formation of the insulation layer 144, a drain contact opening 146 (called via) is etched through the insulation layer 144 and insulation layer 138 to expose a part of the drain implant region 128. A layer of metal, preferably W deposited by CVD and called a W plug, is then deposited to fill the via 146. Actually the typical W plug recipe includes a deposition of a Ti/TiN/W followed by a removal of the excess of the metal by CMP (Chemical-Mechanical Polish). The CMP is stopped on the surface of the insulating layer 144 and leaves a perfectly flat surface. The W plug step is followed by a sputter of Ti/TiN/Al metal stack 148 to form a continuous drain electrode and to completely cover insulation layer 144. Finally, the top drain metal is patterned to form a drain electrode that substantially covers only on the active area of the device, which can comprise many cells like transistor 100 depicted in FIG. 2 when packaged, while leaving room for gate contact(s). These cells are connected in parallel to allow handling of large currents. As opposed to the prior art design with a finger type of layout of the drain electrode, the device according to the invention takes full advantage of a device with a vertical current flow without any de-biasing effect.

In addition to providing a simplified manufacturing technique and structure for the source contact, gate shield and field plate, as well as improved drain electrode, the LDMOS 100 as shown in FIG. 2. provides an epitaxial layer 114 that is fully overdoped, meaning both the body region 132 and lightly doped drain region 126 abut the substrate 112. This doping architecture places the body region of the LDMOS device 100 on the substrate, meaning minority carriers no longer need to flow laterally to the source contact during the avalanche condition (i.e., when the electric field at the body-to-drain PN-junction is so high that it leads to a generation of minority carriers by impact ionization) as a shorter path is provided to the substrate 112. This assures that there is no turn-on of the parasitic bipolar transistor what would destroy the device.

Still further, the breakdown behavior is improved by forming a junction between the lightly doped drain region 126 and the substrate 112. At high blocking voltage, high electric fields that are spread laterally by the field plate 152 are localized around the junction between the substrate 112 and the LDD region 126. This junction goes into the avalanche condition first. The doping architecture increases the reliability of the LDMOS transistor 100 as it moves the hot carriers far away from the gate dielectric layer 124, eliminating hot carrier injection problems associated with prior art devices. Furthermore, the avalanche condition ruggedness is of particular interest in power applications where high voltage spikes can occur and the transistor is supposed to absorb the energy generated during these short time periods.

Figure 3:
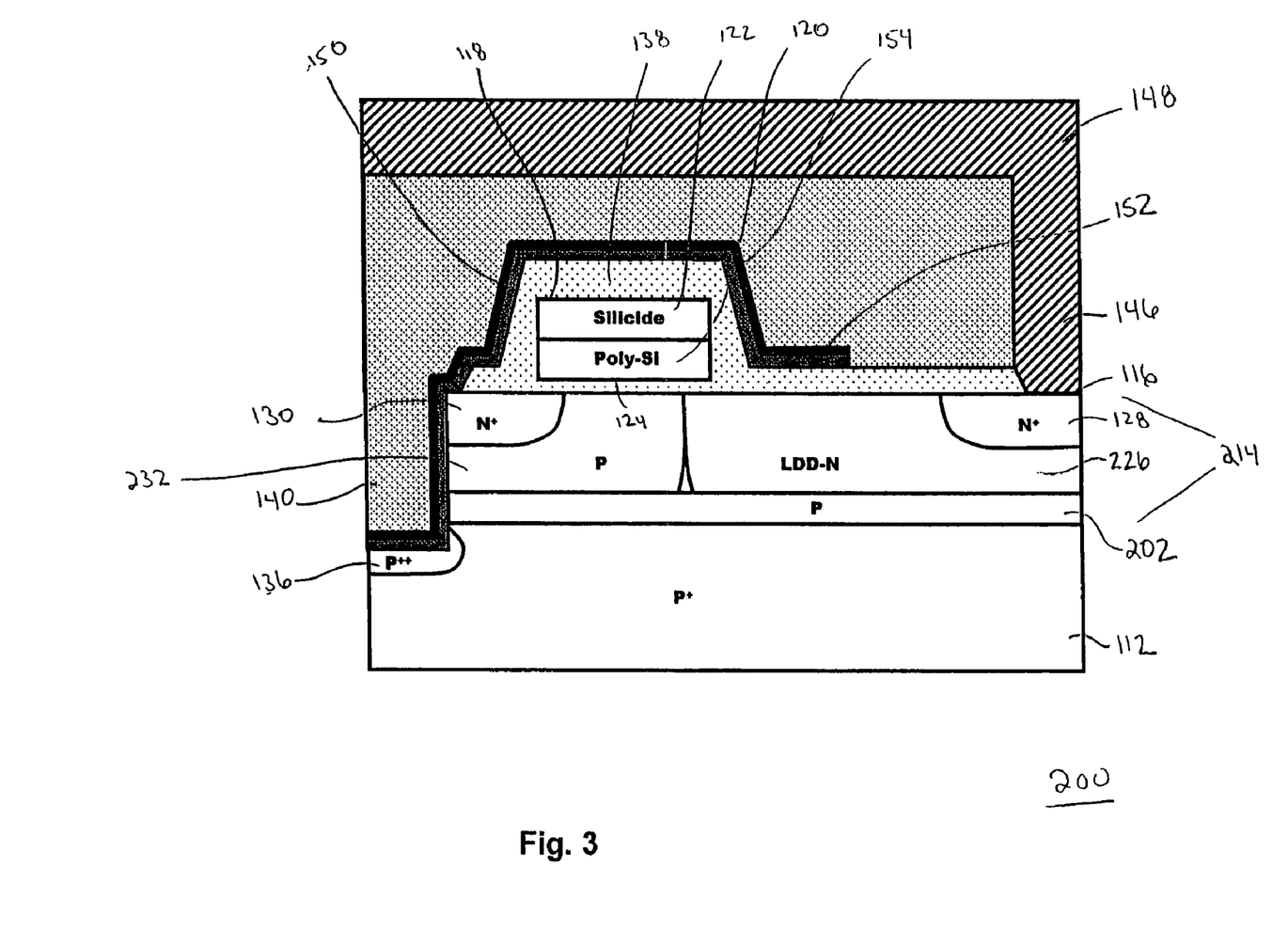
FIG. 3 is an illustration of an alternative embodiment of an improved LDMOS transistor of FIG. 2 having a buffer layer.

FIG. 3 is an alternative embodiment of an improved LDMOS transistor 200. The transistor 200 is identical to the transistor 100 of FIG. 2 except for epitaxial layer 214, which includes a buffer region 202 formed between the substrate 112 and the compressed body region 232 and lightly doped drain region 226. In an exemplary embodiment, the buffer region 202 comprises a layer of silicon doped with p-dopants at a concentration equal to or greater than the dopant concentration of the body region 232. The buffer layer 202 abuts the sidewalls of source contact layer 150 and is preferably formed to a thickness between about 0.3 to 0.6 μm. In one embodiment, the buffer layer 202 is formed by deep implantation of Boron into the epitaxial layer 214 before the formation of the gate 118. The buffer layer 202 serves to suppress the well documented short channel effects by helping to ensure that the depletion region does not reach too far into the channel. The buffer layer also provides a means for a better control and reproducibility of the breakdown voltage of the transistor. The breakdown is limited between the drain contact region 128 and the buffer layer 202, rather than between the drain contact region 128 and the upper surface of the substrate 112. In the prior art, the breakdown voltage is sensitive to the distance between the drain contact region 128 and the diffusion profile of the dopant supplied by the substrate. In other words, the breakdown voltage in the prior art depends on the thickness of the epitaxial layer and on the doping concentration in the substrate which parameters can not be controlled tightly.

Figure 4:
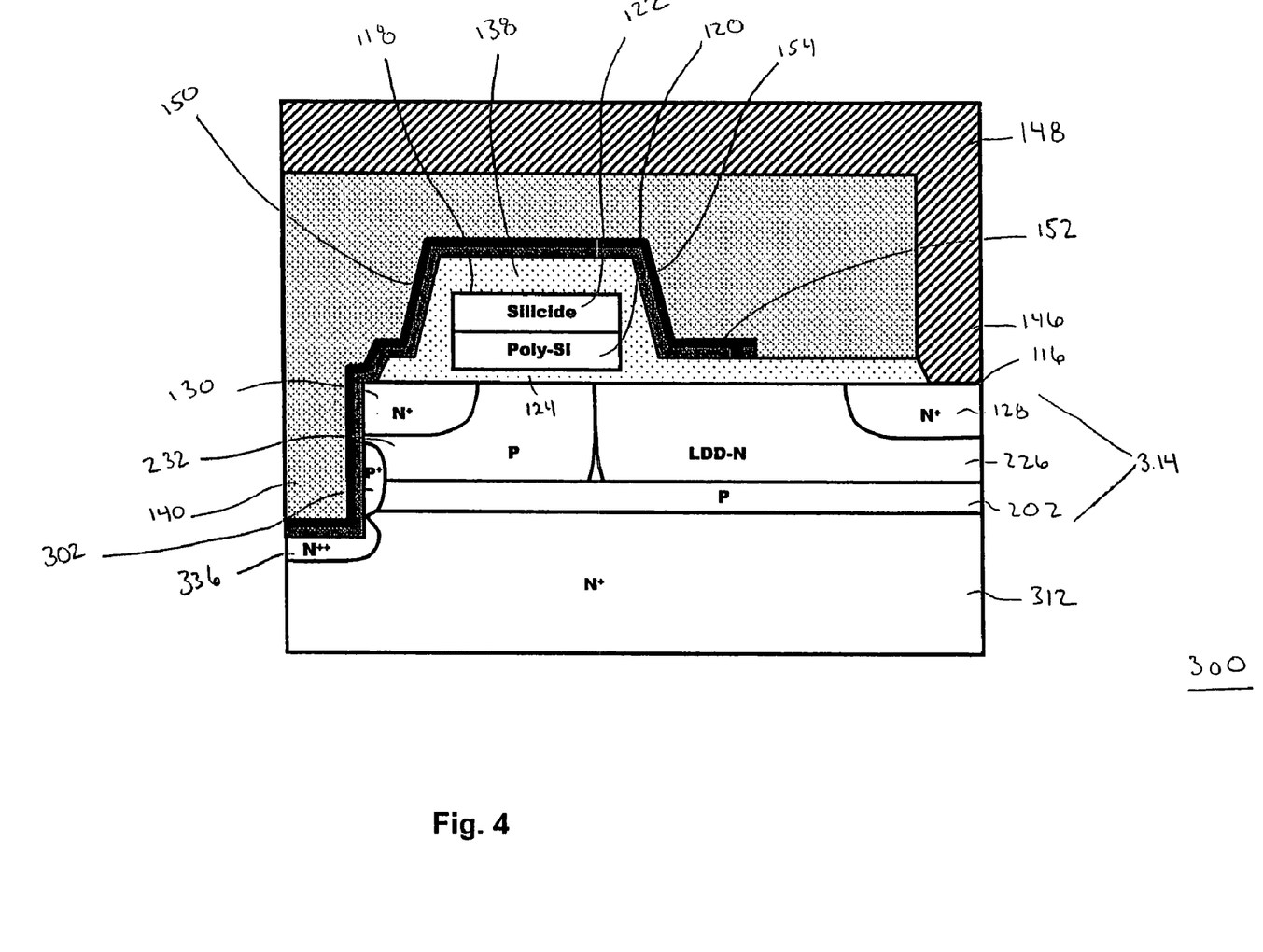
FIG. 4 is an illustration of another alternative embodiment of the improved LDMOS transistors of FIGS. 2 and 3 formed on an N-doped substrate.

Although n-channel devices may be preferred for their lower channel resistance compared to p-channel devices, the p-doped substrates of prior art n-channel devices offer much higher resistances than n-substrates, often 2 to 3 times higher. FIG. 4 is an illustration of another embodiment of an exemplary LDMOS transistor where an n-channel device is fabricated on a low resistance n-doped substrate 312. The device exhibits low on-resistance ($Rd_{ds-on}$) by lowering the resistive contribution of the substrate 312.

The LDMOS transistor 300 of FIG. 4 is the same in all respects to the transistor 200 of FIG. 3 except for N+ doped substrate 312, N++ highly doped contact region 336 formed in the N+ substrate 312, and P+ doped region 302 formed in the sidewall of epitaxial layer 314 adjacent the trench 140. The P+ doped region 302 assures a good ohmic contact between the body and buffer regions 232 and 202, and the metal contact layer 150 creating an electric short with the source region 130 and the substrate 312. In FIG. 3 the buffer layer 202 forms an intrinsic good contact to the substrate—there is no PN barrier like in FIG. 4. In the embodiment according to FIG. 4, the buffer layer 202 has to provide enough charge to accommodate the depletion layer extending from the LDD region 226, and to make sure that the Gummel number for the parasitic NPN bipolar transistor appearing between the drain contact region 128 and the substrate 312 is large enough to suppress the bipolar action.

Figure 5:
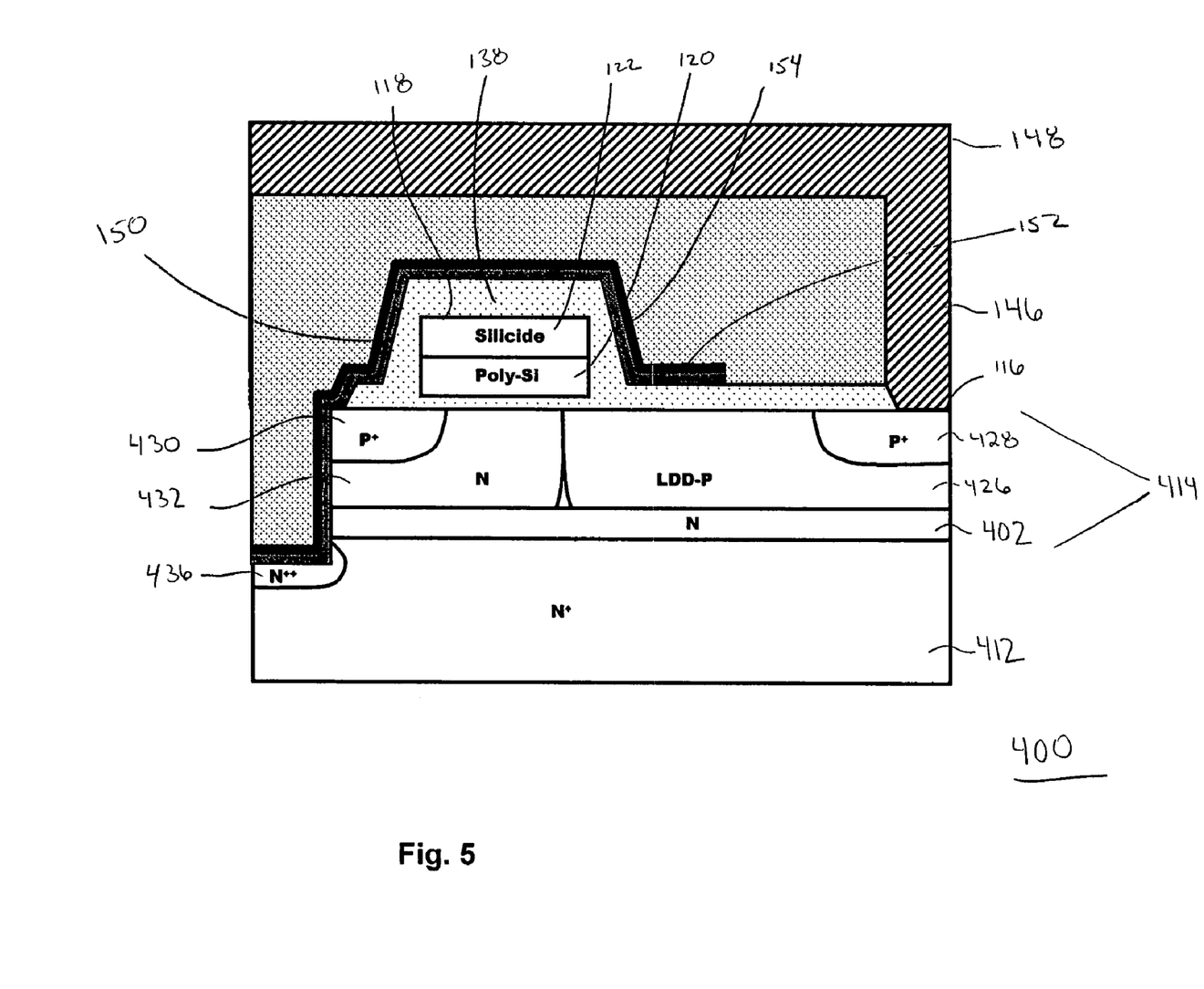
FIG. 5 is an illustration of an exemplary embodiment of a p-channel LDMOS transistor according to the present invention.

FIG. 5 illustrates an embodiment of a p-channel LDMOS device 400 similar in construction to the n-channel devices detailed above, except as described below. LDMOS transistor 400 is fabricated on a low-resistance N+ doped substrate 412 having an epitaxial layer 414 formed thereover. The epitaxial layer 414 has P+ doped drain implant region 428 and P+ doped source implant region 430 formed therein. An n-doped body implant region 432 is formed partially underlying conductive gate 118, forming a channel thereunder, and source implant region 430. A lightly doped enhanced drift region 426 is formed between the body region 432 and the drain implant region 428. A highly doped (N++) contact region 436 is implanted into the N+ substrate 436 to form low resistance contact between the substrate 412 and the source contact formed from the conductive layer 150. A buffer layer 402 having dopant concentration equal to or greater than the body region 432 is formed between the substrate 412 and the body and enhanced drain drift regions 432, 426.

As the channel length of devices decreases, particularly p-channel devices, the contribution of the N+ substrate to the on-resistance of the devices becomes increasingly more important. It has historically been much easier to get low resistivity from n-channel devices than from p-channel devices, as p-channel devices typically have 2.5 times worse performance than similar n-channel devices. The embodiment of FIG. 5, however, provides a p-channel device on an n-substrate with vertical current flow. By utilizing a thin N+ substrate, such as less than 100 µm, and preferably less than about 75 µm, and most preferably equal to about 50 µm, a p-channel device 400 can be fabricated having on-resistance performance comparable to n-channel devices, as the very thin, low resistance N+ substrate offsets the higher resistance p-channel of the device. In turn, this enables the fabrication of complimentary metal oxide semiconductor (CMOS) power devices using complimentary n and p-channel LDMOS devices, as the respective n-channel and p-channel devices can be fabricated to have similar performances, i.e., matched.

Although FIGS. 2-5 also show embodiments of transistors having both improved dopant profiles and improved source contact and drain electrode structures, this is not a requirement. The improved dopant profile may be used in connection with prior art or other source contact and/or drain electrode configurations, as the improved source contact and/or drain electrode configuration can be used with prior art or other dopant profiles.

In an exemplary application, the improved power LDMOS device is fabricated in parallel with a plurality of other similarly structured devices and packaged for use as a power transistor in, for example, a DC/DC voltage regulator.

The above-described LDMOS transistor provides the advantageous switching performance of an LDMOS transistor while introducing a large current handling capability due to a large vertical current flow and large, continuous source and drain electrodes. At the same time, the pitch of the design of the device cell is minimized by the implementation of the continuous source contact structure which provides for a high channel density (i.e., specific Rds is Rds multiplied by the transistor area, so smaller pitch means smaller Rds*A) and resulting specific low on-resistance of the transistor. Further, the improved LDMOS device provides manufacturing advantages, as various elements can be formed from a single, continuous conductive layer. The contribution of the substrate to the overall resistance of the device is advantageously kept at a low level by using substrates having thicknesses of less than 100 µm, and more preferably less than about 75 µm, and most preferably thicknesses of about 50 µm.

In the following table, the forecasted performance of 20V transistors designed according to the embodiments from FIGS. 3 and 5 is compared to the performance of state of the art P-channel and N-channel products.

| Parameter | Rds(2.5 V) mΩ*cm² | Rds(4.5 V) mΩ*cm² | Qg(4.5 V) nC/cm² | Qgd nC/cm² |
|---|---|---|---|---|
| prior Nch | 0.26 | 0.19 | 400 | 110 |
| Nch acc. FIG. 3 | 0.18 | 0.13 | 250 | 50 |
| prior Pch | 0.62 | 0.38 | 800 | 230 |
| Pch acc. FIG. 5 | 0.26 | 0.16 | 280 | 50 |

The results from numeric simulation presented in the table show that the largest improvement can be expected from Pch devices. The devices designed according to the embodiment from FIG. 5 show about 2× improvement in specific on-resistance, 3× in specific Qg and about 4× in Qgd as compared to prior products. The Pch and Nch devices according to this invention have much better matched parameters than the state of the art transistors.

The devices designed for a $V_{ds,max}$ of 20V with parameters collected in the above table are very useful for application in portable electronic equipment like PDA's, MP3 players, digital cameras and similar devices. Especially, the Pch devices combine the advantage of a low on-resistance transistors with very low values for the gate charge (Qg) and Miller charge (Qgd), which enables their use in switching applications, like a simple buck converter using a Pch transistor as a control switch and a Schottky diode as the free wheeling diode.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A laterally diffused metal-oxide-semiconductor transistor device comprising:

a doped substrate having bottom and top surfaces and an epitaxial layer thereover having an upper surface;

source and drain regions of a first conductivity type formed in the epitaxial layer proximate the upper surface of said epitaxial layer, said source and drain regions being spaced from one another and having a channel region of a second conductivity type formed therebetween in said epitaxial layer, said channel region having a portion extending under said source region, wherein said drain region comprises a lightly doped drain region formed adjacent to said channel region;

a doped drain contact region spaced from said channel region by said lightly doped drain region;

a conductive gate having an upper surface and sidewall surfaces, said conductive gate formed over a gate dielectric layer formed over said channel region, said conductive gate partially overlapping said source and drain regions;

a trench formed through said epitaxial layer at least to said top surface of said substrate, said trench having a bottom surface and a sidewall contacting said source region and said portion of said channel region extending under said source region;

a first insulating layer formed over said upper surface and sidewall surfaces of said conductive gate;

a continuous layer of conductive material forming a source contact and a gate shield electrode, said continuous layer of conductive material formed along said bottom surface and said sidewall of said trench and over said first insulating layer to cover said top and sidewall surfaces of said conductive gate;

a second insulating layer formed over an active area of said transistor, including over said continuous layer of conductive material, said second insulating layer filling said trench; and a drain electrode electrically coupled to said drain contact.

2. The device of claim 1, wherein said drain electrode comprises a first portion extending through said second insulating layer electrically coupled to said drain contact and a second portion extending over the second insulating layer to substantially cover said active area.

3. The device of claim 1, wherein said substrate has a thickness of less than 100 µm and greater than or equal to about 50 µm.

4. The device of claim 1, wherein said second conductivity type is P conductivity type and said substrate is doped with dopants of said second conductivity type and said first conductivity type is N conductivity type.

5. The device of claim 1, further comprising a highly doped contact region formed in said substrate proximate to the bottom of said trench and contacting said continuous layer.

6. The device of claim 1, wherein said first insulating layer comprises a portion that at least partially covers said drain region, said conductive continuous layer extending at least partially over said portion of said first insulating layer to form a field plate.

7. The device of claim 6, wherein said portion of said insulating layer has a thickness between about 0.05-0.15 µm.

8. The device of claim 1, further comprising a snubber electrically coupled between the drain and source contact regions.

9. The device of claim 8, wherein said snubber comprises a resistor formed from a portion of said continuous layer of conductive material, said portion comprising at least one opening formed through said continuous layer of conductive material.

10. A packaged device, comprising a plurality of laterally diffused metal-oxide-semiconductor transistor devices as defined in claim 1 electrically coupled in parallel.

* * * * *